United States Patent
Yun et al.

(10) Patent No.: US 9,773,862 B2
(45) Date of Patent: Sep. 26, 2017

(54) HIGH QUALITY FACTOR CAPACITORS AND METHODS FOR FABRICATING HIGH QUALITY FACTOR CAPACITORS

(71) Applicant: QUALCOMM Incorporated, San Diego, CA (US)

(72) Inventors: Changhan Hobie Yun, San Diego, CA (US); Daeik Daniel Kim, Del Mar, CA (US); Chengjie Zuo, San Diego, CA (US); Jonghae Kim, San Diego, CA (US); Mario Francisco Velez, San Diego, CA (US); Donald William Kidwell, Jr., Campbell, CA (US); Jon Bradley Lasiter, Stockton, CA (US); Kwan-Yu Lai, Campbell, CA (US); Jitae Kim, Mountain View, CA (US); Ravindra Vaman Shenoy, Dublin, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 15/375,137

(22) Filed: Dec. 11, 2016

(65) Prior Publication Data
US 2017/0125512 A1    May 4, 2017

Related U.S. Application Data (62) Division of application No. 14/177,072, filed on Feb. 10, 2014, now Pat. No. 9,548,350.

(51) Int. Cl.
*H01L 21/4763* (2006.01)
*H01L 49/02* (2006.01)
(Continued)

(52) U.S. Cl.
CPC ........ *H01L 28/90* (2013.01); *H01L 21/28282* (2013.01); *H01L 21/76898* (2013.01); *H01L 23/481* (2013.01); *H01L 27/0805* (2013.01)

(58) Field of Classification Search
CPC ............... H01L 23/481; H01L 27/0805; H01L 21/76898; H01L 21/28282
(Continued)

(56) References Cited

U.S. PATENT DOCUMENTS

| | | |
|---|---|---|
| 5,925,921 A | 7/1999 | Susak |
| 6,342,734 B1 | 1/2002 | Allman et al. |

(Continued)

OTHER PUBLICATIONS

International Search Report and Written Opinion—PCT/US2015/014995—ISA/EPO—dated May 11, 2015.

*Primary Examiner* — Matthew E Warren
(74) *Attorney, Agent, or Firm* — Muncy, Geissler, Olds & Lowe (57) ABSTRACT

Provided are space-efficient capacitors that have a higher quality factor than conventional designs and improve coupling of electrical energy from a through-glass via (TGV) to a dielectric. For example, provided is a TGV having a non-rectangular cross-section, where one end of the TGV is coupled to a first metal plate. A dielectric material is formed on the first metal plate. A second metal plate is formed on the dielectric material in a manner that overlaps at least a portion of the first metal plate to form at least one overlapped region of the dielectric material. At least a part of the perimeter of the overlapped region is non-planar. The overlapped region can be formed in a shape of a closed ring, in a plurality of portions of a ring shape, in substantially a quarter of a ring shape, and/or in substantially a half of a ring shape.

14 Claims, 6 Drawing Sheets

(51) Int. Cl.
*H01L 27/08* (2006.01)
*H01L 23/48* (2006.01)
*H01L 21/28* (2006.01)
*H01L 21/768* (2006.01)

(58) Field of Classification Search
USPC .................. 257/528, 532; 438/381, 396, 637
See application file for complete search history.

(56) References Cited

U.S. PATENT DOCUMENTS

| | | |
|---|---|---|
| 7,282,757 B2 | 10/2007 | Tu et al. |
| 7,525,140 B2 | 4/2009 | Min et al. |
| 7,755,166 B2 | 7/2010 | Kariya |
| 8,502,338 B2 | 8/2013 | Yen et al. |
| 2009/0161298 A1 | 6/2009 | Lee et al. |
| 2012/0146182 A1* | 6/2012 | Oganesian ............ H01L 23/481 257/532 |
| 2013/0256834 A1 | 10/2013 | Tan et al. |
| 2013/0278568 A1 | 10/2013 | Lasiter et al. |
| 2015/0228712 A1 | 8/2015 | Yun et al. |

* cited by examiner

HIGH QUALITY FACTOR CAPACITORS AND METHODS FOR FABRICATING HIGH QUALITY FACTOR CAPACITORS

CLAIM OF PRIORITY UNDER 35 U.S.C. §120

The present Application for Patent is a divisional of U.S. patent application Ser. No. 14/177,072, entitled "HIGH QUALITY FACTOR CAPACITORS AND METHODS FOR FABRICATING HIGH QUALITY FACTOR CAPACITORS," filed Feb. 10, 2014, pending, assigned to the assignee hereof, and expressly incorporated herein by reference in its entirety.

FIELD OF DISCLOSURE

This disclosure relates generally to electronics, and more specifically, but not exclusively, to a high-Q ring/crescent capacitor.

BACKGROUND

As integrated circuit operating frequencies (f) increase, there is a commensurate increase in the required capacitor quality factor (Q) of capacitors used in the integrated circuit. Capacitor "Q" represents the energy efficiency of a capacitor, and can be determined by $Q=Xc/Rc$, where "Xc" is capacitive reactance of the capacitor and "Rc" is the equivalent series resistance (ESR) of the capacitor. The "Xc" of the capacitor is determined by $Xc=1/2\pi fC$, where C=capacitance. Thus, when capacitance is constant, as "f" goes up, "Xc" goes down and "Q" goes down. Increasing "f" also leads to losing energy by heating of the integrated circuit, which in turn leads to an increase in thermal noise in the high-frequency integrated circuit.

Conventional metal-insulator-metal (MIM) capacitors located near a through-glass via (TGV) have rectangular-shaped dielectrics that are space-inefficient. Further, the rectangular-shaped dielectrics of the conventional MIM capacitors limit the maximum "Q" of the conventional MIM capacitors. Thus, there is a need for MIM capacitors located near a TGV that are space-efficient, energy efficient, and have a higher "Q" when compared to conventional devices.

Accordingly, there are long-felt industry needs for methods and apparatus that improve upon conventional methods and apparatus, including the improved methods and apparatus provided hereby.

SUMMARY

This summary provides a basic understanding of some aspects of the present teachings. This summary is not exhaustive in detail, and is neither intended to identify all critical features, nor intended to limit the scope of the claims.

Exemplary methods and apparatus for fabricating a capacitor are provided. In an example, a through-glass via (TGV) having a non-rectangular cross-section is formed on a substrate and a first metal plate is formed, where one end of the TGV is coupled to the first metal plate. The first metal plate can be formed substantially planar. Further, a dielectric material is formed on the first metal plate. A second metal plate is formed on the dielectric material in a manner that overlaps at least a portion of the first metal plate to form at least one overlapped region of the dielectric material, where at least a part of the perimeter of the overlapped region is non-planar. The TGV can be formed substantially cylindrically-shaped and have an axis, where the overlapped region has at least a portion of a ring shape that is substantially centered about the axis of the TGV. The overlapped region can be formed in a shape of a closed ring substantially centered about the axis of the TGV. The overlapped region can be formed as at least one of: a plurality of portions of the ring, substantially a quarter of the ring, and substantially a half of the ring. An inner radius of the ring can be greater than an outer radius of the cylindrically-shaped TGV. The overlapped region is formed substantially in a plane extending from an outer radius of the ring.

In a further example, provided is a non-transitory computer-readable medium, comprising instructions stored thereon that, if executed by a processor, such as a special-purpose processor, cause the processor to execute at least a part of the aforementioned method. The non-transitory computer-readable medium can be integrated with a device, such as a lithographic device and/or a semiconductor fabrication control computer. Also provided are steps for performing the at least a part of the aforementioned method.

In another example, provided is an apparatus including a capacitor. The capacitor includes a TGV having a non-rectangular cross-section, where one end of the TGV is coupled to a first metal plate. The first metal plate can be substantially planar. A dielectric material is formed on the first metal plate. A second metal plate is formed on the dielectric material in a manner that overlaps at least a portion of the first metal plate to form at least one overlapped region of the dielectric material. At least a part of the perimeter of the overlapped region is non-planar. The overlapped region can be formed in a shape of a closed ring, in a plurality of portions of a ring shape, in substantially a quarter of a ring shape, and/or in substantially a half of a ring shape. The TGV can be substantially cylindrically-shaped and have an axis. The overlapped region can have at least a portion of a ring shape that is substantially centered about the axis of the TGV. An inner radius of the ring can be greater than an outer radius of the cylindrically-shaped TGV. Further, the overlapped region can be substantially in a plane extending from an outer radius of the ring.

At least a part of the apparatus can be integrated on a semiconductor die. Further, at least a part of the apparatus can include a device, such as a mobile device, a base station, a set top box, a music player, a video player, an entertainment unit, a navigation device, a communications device, a personal digital assistant (PDA), a fixed location data unit, and/or a computer, with another part of the apparatus being a constituent part of the device. In a further example, provided is a non-transitory computer-readable medium, comprising instructions stored thereon that, if executed by a lithographic device, cause the lithographic device to fabricate at least a part of the apparatus.

The foregoing broadly outlines some of the features and technical advantages of the present teachings in order that the detailed description and drawings can be better understood. Additional features and advantages are also described in the detailed description. The conception and disclosed embodiments can be readily utilized as a basis for modifying or designing other structures for carrying out the same purposes of the present teachings. Such equivalent constructions do not depart from the technology of the teachings as set forth in the claims. The inventive features that are characteristic of the teachings, together with further objects and advantages, are better understood from the detailed description and the accompanying figures. Each of the figures is provided for the purpose of illustration and description only, and does not limit the present teachings.

BRIEF DESCRIPTION OF THE DRAWINGS

The accompanying drawings are presented to describe examples of the present teachings, and are not limiting.

FIGS. 1A-1D and 2A-2E depict exemplary views of exemplary high-Q metal-insulator-metal (MIM) capacitors.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

INTRODUCTION

Provided are high quality factor (Q) ring/crescent metal-insulator-metal (MIM) capacitors that are improved over conventional devices, as well as methods for fabricating the high-Q ring/crescent capacitors.

In an example, a MIM capacitor comprises a TGV having a non-rectangular cross-section, where one end of the TGV is coupled to a first metal plate. A dielectric material is formed on the first metal plate. A second metal plate is formed on the dielectric material in a manner that overlaps at least a portion of the first metal plate to form at least one overlapped region of the dielectric material. At least a part of the perimeter of the overlapped region is non-planar. The overlapped region can be formed in a shape of a closed ring, in a plurality of portions of a ring shape, in substantially a quarter of a ring shape, in substantially a half of a ring shape and/or the like.

The exemplary apparatuses and methods disclosed herein advantageously address the long-felt industry needs, as well as other previously unidentified needs, and mitigate shortcomings of the conventional methods and apparatus. For example, advantages provided by the disclosed apparatuses and methods herein include improvements in space-efficiency, capacitor quality factor over conventional designs, coupling of electrical energy from a through-glass via to a dielectric, and a reduction in energy loss.

Exemplary embodiments are disclosed in this application's text and drawings. Alternate embodiments can be devised without departing from the scope of the invention. Additionally, conventional elements of the current teachings may not be described in detail, or may be omitted, to avoid obscuring aspects of the current teachings.

As used herein, the term "exemplary" means "serving as an example, instance, or illustration." Any embodiment described as "exemplary" is not necessarily to be construed as preferred or advantageous over other embodiments. Likewise, the term "embodiments of the invention" does not require that all embodiments of the invention include the discussed feature, advantage, or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

It should be noted that the terms "connected," "coupled," or any variant thereof, mean any connection or coupling, either direct or indirect, between elements, and can encompass a presence of an intermediate element between two elements that are "connected" or "coupled" together via the intermediate element. Coupling and/or connection between the elements can be physical, logical, or a combination thereof. As employed herein, elements can be "connected" or "coupled" together, for example, by using one or more wires, cables, and/or printed electrical connections, as well as by using electromagnetic energy. The electromagnetic energy can have wavelengths in the radio frequency region, the microwave region and/or the optical (both visible and invisible) region. These are several non-limiting and non-exhaustive examples.

It should be understood that the term "signal" can include any signal such as a data signal, audio signal, video signal, multimedia signal, analog signal, and/or digital signal. Information and signals can be represented using any of a variety of different technologies and techniques. For example, data, an instruction, a process step, a command, information, a signal, a bit, and/or a symbol described in this description can be represented by a voltage, a current, an electromagnetic wave, a magnetic field and/or particle, an optical field and/or particle, and any combination thereof.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

The terminology used herein is for the purpose of describing particular embodiments only and is not intended to be limiting. As used herein, the singular forms "a," "an", and "the" are intended to include the plural forms as well, unless the context clearly indicates otherwise. Further, the terms "comprises," "comprising," "includes," and "including," when used herein, specify a presence of stated features, integers, steps, operations, elements, and/or components, but do not preclude the presence and/or addition of one or more other features, integers, steps, operations, elements, components, and/or groups thereof.

In this description, certain terminology is used to describe certain features. The term "mobile device" can describe, and is not limited to, a mobile phone, a mobile communication device, a pager, a personal digital assistant, a personal information manager, a mobile hand-held computer, a laptop computer, a wireless device, a wireless modem, and/or other types of portable electronic devices typically carried by a person and/or having communication capabilities (e.g., wireless, cellular, infrared, short-range radio, etc.). Further, the terms "user equipment" (UE), "mobile terminal," "mobile device," and "wireless device," can be interchangeable.

DESCRIPTION OF THE FIGURES

FIGS. 1A-1D and 2A-2E depict exemplary views of exemplary high-Q MIM capacitors that are improved over conventional devices. The non-planar (i.e., curved) design of the MIM capacitors' dielectric: (1) increases the area of the MIM capacitor dielectric that is in contact with the upper and lower plates of the MIM capacitor, and (2) improves coupling of electrical energy from a cylindrical through-glass via (TGV) to the MIM capacitor dielectric by matching the physical geometry of the dielectric to the physical geometry of the input electrical energy (i.e., adapting the physical geometry of the dielectric to the skin effects of current flow in the TGV (e.g., at high frequencies). The improved coupling reduces energy loss to increase Q over conventional designs.

As used herein, a description of a component location relative to an axis of a cylindrical TGV can refer to a case in which the axis of the cylindrical TGV extends beyond the limits of the structure of the cylindrical TGV. Further, a radius of the axis of the cylindrical TGV can also be extended along the extended axis and beyond the limits of the structure of the cylindrical TGV. In other words, to describe a component location, reference can be made herein to an imaginary extension of a TGV axis and/or a TGV radius beyond the structure of the cylindrical TGV.

As used herein, an "overlapped region" of dielectric material can refer to a portion of a dielectric material that is located between two metal plates (thus the overlapped region forms a constituent part of a capacitor), where the dielectric material as a whole extends beyond at least one of the two metal plates. The extents of an overlapped region can be determined from a shape of at least one of the two metal plates. In other words, the shape of at least one metal plate determines at least a part of the shape and at least a part of the size of the overlapped region of dielectric material. Also, an "overlapped region" of dielectric material can refer to a discrete structure of dielectric material that is located between two metal plates. The overlapped region of dielectric material forms the dielectric of a capacitor, with the metal plates forming the capacitor's plates.

Figure 1A:
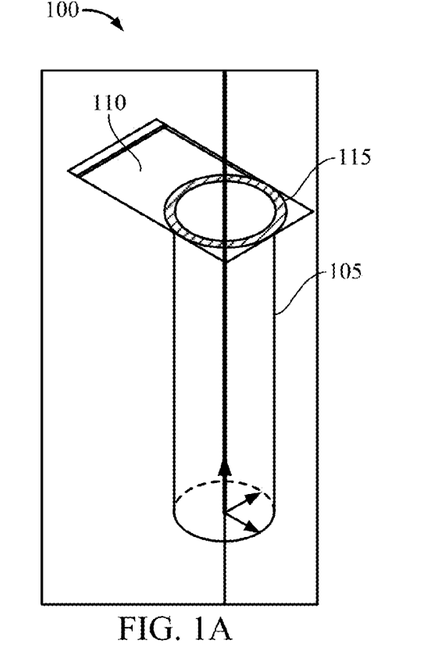

FIG. 1A depicts an exemplary view of a first MIM capacitor 100 having a high-Q and coupled to a TGV 105. The first MIM capacitor 100 includes a substantially planar metal plate 110 and a substantially ring-shaped overlapped region of dielectric material 115. The substantially ring-shaped overlapped region of the dielectric material 115 is substantially centered about an axis of the TGV 105, and has an inner radius that is outside of the outer radius of the TGV 105.

Also, an additional metal plate is coupled to the substantially ring-shaped overlapped region of dielectric material 115 to complete the first MIM capacitor 100. The portion of the additional metal plate that contacts the substantially ring-shaped overlapped region of the dielectric material 115 can have substantially the same dimensions as a face of the substantially ring-shaped overlapped region of the dielectric material 115.

Figure 3A:
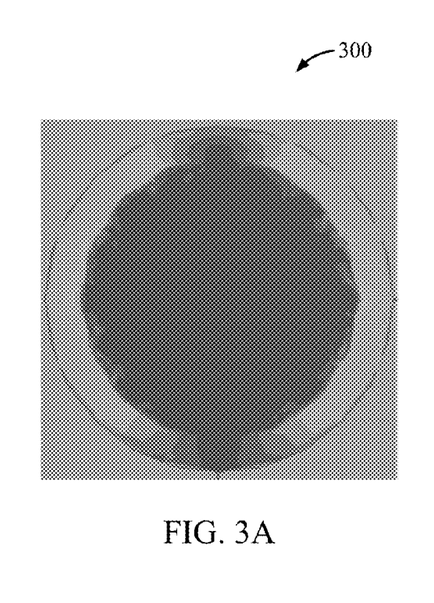
FIGS. 3A-3D depict exemplary respective current flows through high-Q MIM capacitors.

During operation of the first MIM capacitor 100, current flows through the TGV 105 to the metal plate 110 and then through the substantially ring-shaped overlapped region of dielectric material 115 to the additional metal plate. FIG. 3A depicts exemplary current flow 300 on the portion of the TGV 105 that contacts the metal plate 110.

Figure 1B:
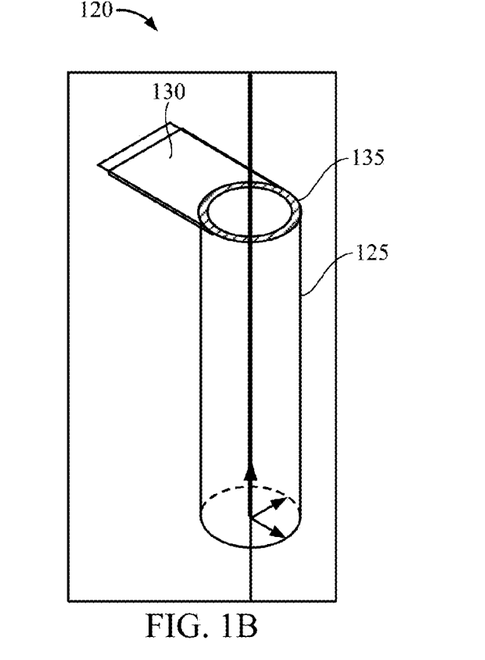

FIG. 1B depicts an exemplary view of a second MIM capacitor 120 having a high-Q and coupled to a TGV 125. The second MIM capacitor 120 includes a substantially planar metal plate 130 and a substantially ring-shaped overlapped region of dielectric material 135. The substantially ring-shaped overlapped region of the dielectric material 135 is substantially centered about an axis of the TGV 125, and has an outer radius that is substantially on or inside of the outer radius of the TGV 125.

Also, an additional metal plate is coupled to the substantially ring-shaped overlapped region of the dielectric material 135 to complete the second MIM capacitor 120. The portion of the additional metal plate that contacts the substantially ring-shaped overlapped region of the dielectric material 135 can have substantially the same dimensions as a face of the substantially ring-shaped overlapped region of the dielectric material 135.

Figure 3B:
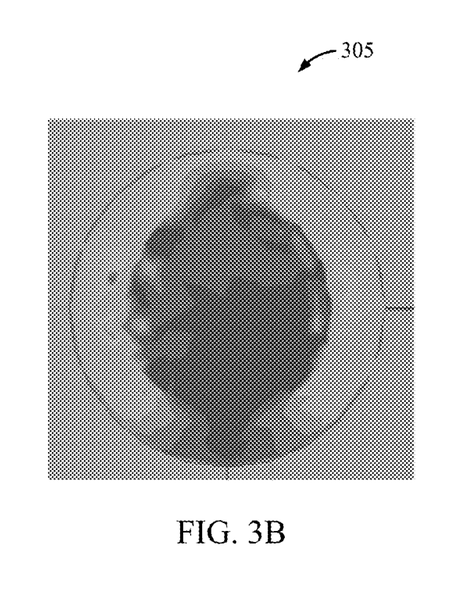

During operation of the second MIM capacitor 120, current flows through the TGV 125 to the metal plate 130 and then through the substantially ring-shaped overlapped region of the dielectric material 135 to the additional metal plate. FIG. 3B depicts exemplary current flow 310 on the portion of the TGV 125 that contacts the metal plate 130.

Figure 1C:
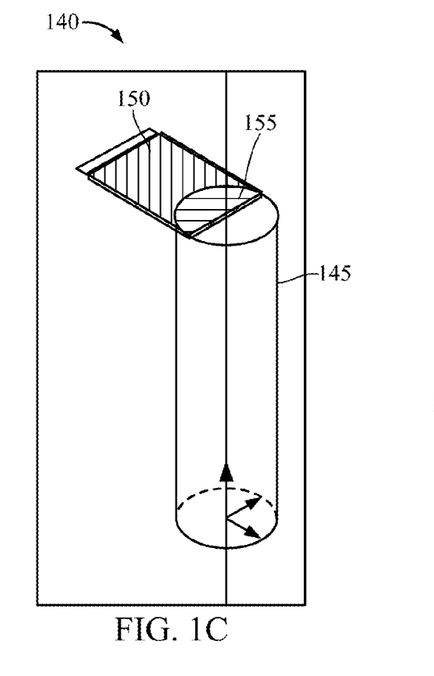

FIG. 1C depicts an exemplary view of a third MIM capacitor 140 having a high-Q and coupled to a TGV 145. The third MIM capacitor 140 includes a substantially planar metal plate 150 and a substantially half-circle-shaped overlapped region of dielectric material 155. The substantially half-circle-shaped overlapped region of the dielectric material 155 is substantially centered about an axis of the TGV 145, and has an outer radius that is substantially on or inside of the outer radius of the TGV 145.

Also, an additional metal plate is coupled to the substantially half-circle-shaped overlapped region of the dielectric material 155 to complete the third MIM capacitor 140. The portion of the additional metal plate that contacts the substantially half-circle-shaped overlapped region of dielectric material 155 can have substantially the same dimensions as a face of the substantially half-circle-shaped overlapped region of dielectric material 155.

Figure 3C:
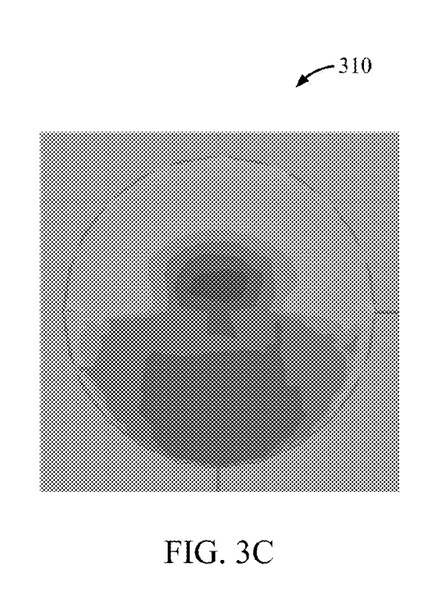

During operation of the third MIM capacitor 140, current flows through the TGV 145 to the metal plate 150 and then through the substantially half-circle-shaped overlapped region of the dielectric material 155 to the additional metal plate. FIG. 3C depicts exemplary current flow 315 on the portion of the TGV 145 that contacts the metal plate 150.

Figure 1D:
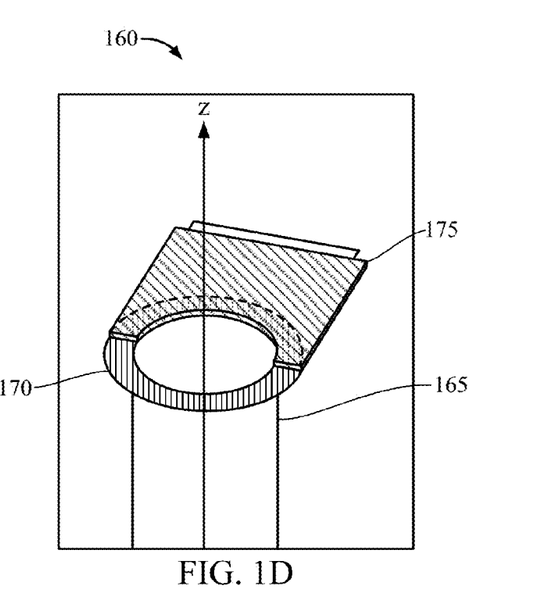

FIG. 1D depicts an exemplary view of a fourth MIM capacitor 160 having a high-Q and coupled to a TGV 165. The fourth MIM capacitor 160 includes a substantially planar metal plate 170 and a substantially half-circle-shaped overlapped region of the dielectric material 175 that is adjacent to the TGV 165. The substantially half-circle-shaped overlapped region of the dielectric material 175 is substantially centered about an axis of the TGV 165, and has a radius that is substantially on and/or outside of the outer radius of the TGV 165.

Also, an additional metal plate is coupled to the substantially half-circle-shaped overlapped region of the dielectric material 175 to complete the fourth MIM capacitor 160. The portion of the additional metal plate that contacts the substantially half-circle-shaped overlapped region of the dielectric material 175 can have substantially the same dimensions as a face of the substantially half-circle-shaped overlapped region of the dielectric material 175.

During operation of the fourth MIM capacitor 160, current flows through the TGV 165 to the metal plate 170 and then through the substantially half-circle-shaped overlapped region of the dielectric material 175 to the additional metal plate.

FIGS. 2A-2J depict exemplary views of exemplary high-Q MIM capacitors. The perspective of FIGS. 2A-2E is of the circular end of a respective TGV that is coupled to a respective MIM capacitor. The perspective of FIGS. 2F-2J is of an oval end of a respective TGV that is coupled to a respective MIM capacitor. During operation of the exemplary high-Q MIM capacitors, from the perspective depicted in each of FIGS. 2A-2J, current can flow through the respective TGV out of the page and then through a respective metal plate to a respective overlapped region of dielectric material where the current flows out or the page to a second respective metal plate where the current also flows out or the page. Alternatively, during operation of the exemplary high-Q MIM capacitors, from the perspective depicted in each of FIGS. 2A-2J, current can flow through "into" the page through a second respective metal plate, "into" the page through a respective overlapped region of dielectric material, though a respective first metal plate, and then "into" the page through the respective TGV.

Figure 2A:
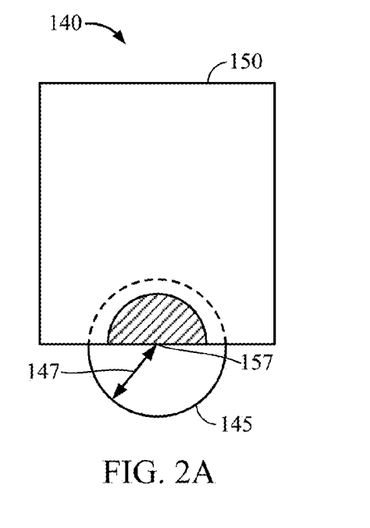
FIGS. 2A-2J depict additional exemplary views of exemplary high-Q MIM capacitors.

FIG. 2A depicts the third MIM capacitor 140, the TGV 145, the substantially planar metal plate 150 and the substantially half-circle-shaped overlapped region of dielectric material 155. The substantially half-circle-shaped overlapped region of dielectric material 155 has a substantially circular edge that is substantially centered on an axis 157 of the TGV 145 and has a radius 147 that is substantially equivalent to that of the TGV 145. In an example, the substantially half-circle-shaped overlapped region of dielectric material 155 does not extend beyond the edges of the metal plate 150. Also, an additional metal plate is coupled to the substantially half-circle-shaped overlapped region of dielectric material 155 to complete the third MIM capacitor 140 and to define the size and shape of the substantially half-circle-shaped overlapped region of dielectric material 155.

Figure 2B:
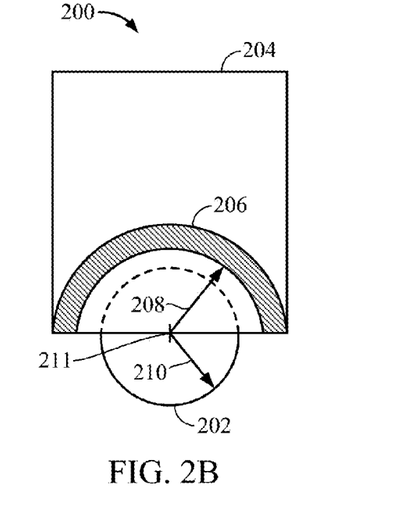

FIG. 2B depicts a fourth MIM capacitor 200, a TGV 202, a substantially planar metal plate 204 and a substantially half-ring-shaped overlapped region of dielectric material 206 having an inner radius 208 that is larger than the outer radius 210 of the TGV 202. The half-ring-shaped overlapped region of dielectric material 206 has substantially circular edges that are substantially centered on an axis 211 of the TGV 202. In an example, the half-ring-shaped overlapped region of dielectric material 206 does not extend beyond the edges of the metal plate 204. Also, an additional metal plate is coupled to the substantially half-ring-shaped overlapped region of dielectric material 206 to complete the fourth MIM capacitor 200 and to define the size and shape of the substantially half-ring-shaped overlapped region of dielectric material 206.

Figure 2C:
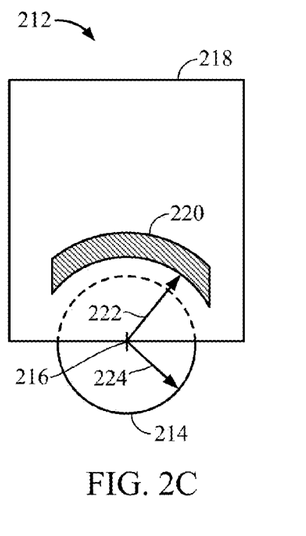

FIG. 2C depicts a fifth MIM capacitor 212, a TGV 214, a substantially planar metal plate 218 and a substantially partially ring-shaped overlapped region of dielectric material 220 having an inner radius 222 that is larger than the outer radius 224 of the TGV 214. The partially ring-shaped overlapped region of dielectric material 220 has substantially circular edges that are substantially centered on an axis 216 of the TGV 214. In an example, the partially ring-shaped overlapped region of dielectric material 220 does not extend beyond the edges of the metal plate 218. Also, an additional metal plate is coupled to the substantially partially ring-shaped overlapped region of dielectric material 220 to complete the fifth MIM capacitor 212 and to define the size and shape of the substantially partially ring-shaped overlapped region of dielectric material 220.

Figure 2D:
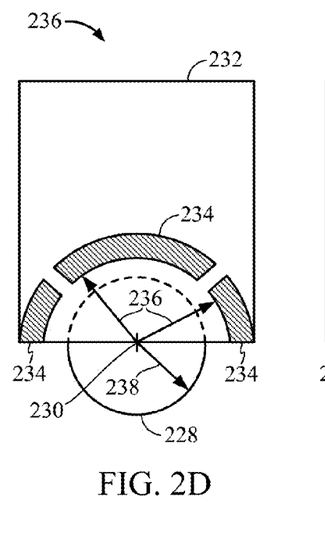

FIG. 2D depicts a sixth MIM capacitor 226, a TGV 228, a substantially planar metal plate 232 and an overlapped region of dielectric material 234 that is substantially formed in a plurality of portions of a ring. The portions of the ring have an inner radius 236 that is larger than the outer radius 238 of the TGV 228. The partially-ring-shaped overlapped region of dielectric material 234 has substantially circular edges that are substantially centered on an axis 230 of the TGV 228. In an example, the dielectric material 234 does not extend beyond any edges of the metal plate 232. Also, an additional metal plate is coupled to the overlapped region of dielectric material 234 to complete the sixth MIM capacitor 226 and to define the size and shape of the overlapped region of dielectric material 234.

Figure 2E:
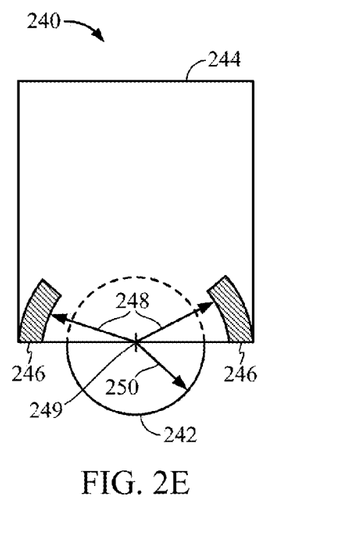

FIG. 2E depicts a seventh MIM capacitor 240, a TGV 242, a substantially planar metal plate 244 and an overlapped region of dielectric material 246 that is substantially formed in a plurality of portions of a ring. The portions of the ring have an inner radius 248 that is larger than the outer radius 250 of the TGV 242. The partially-ring-shaped overlapped region of dielectric material 246 has substantially circular edges that are substantially centered on an axis 249 of the TGV 242. In an example, the partially-ring-shaped overlapped region of dielectric material 246 does not extend beyond the edges of the metal plate 244. Also, an additional metal plate is coupled to the partially-ring-shaped overlapped region of dielectric material 246 to complete the seventh MIM capacitor 240 and to define the size and shape of the overlapped region of dielectric material 246.

Figure 2F:
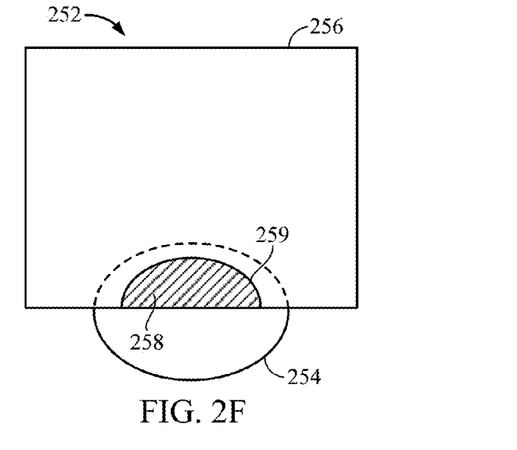

FIG. 2F depicts an eighth MIM capacitor 252, a substantially oval-shaped TGV 254, a substantially planar metal plate 256 and an overlapped region of dielectric material 258. The overlapped region of dielectric material 258 has a substantially oval edge 259. In an example, the overlapped region of dielectric material 258 does not extend beyond the edges of the metal plate 256. Also, an additional metal plate is coupled to the overlapped region of dielectric material 258 to complete the eighth MIM capacitor 252 and to define the size and shape of the overlapped region of dielectric material 258.

Figure 2G:
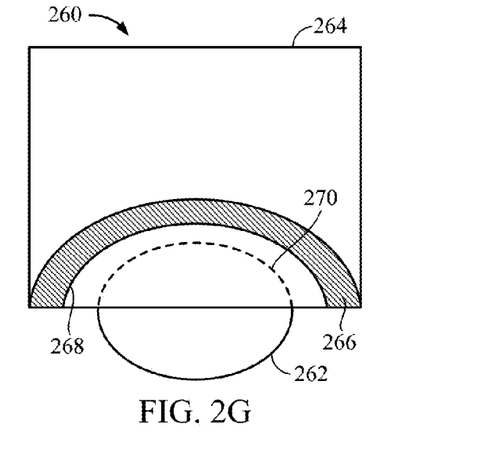

FIG. 2G depicts a ninth MIM capacitor 260, a substantially oval-shaped TGV 262, a substantially planar metal plate 264 and an overlapped region of dielectric material 266 having an inner edge 268 that is larger than the outer edge 270 of the substantially oval-shaped TGV 262. The inner edge 268 of the overlapped region of dielectric material 266 has a substantially concave edge. In an example, the overlapped region of dielectric material 266 does not extend beyond the edges of the metal plate 264. Also, an additional metal plate is coupled to the overlapped region of dielectric material 266 to complete the ninth MIM capacitor 260 and to define the size and shape of the overlapped region of dielectric material 266.

Figure 2H:
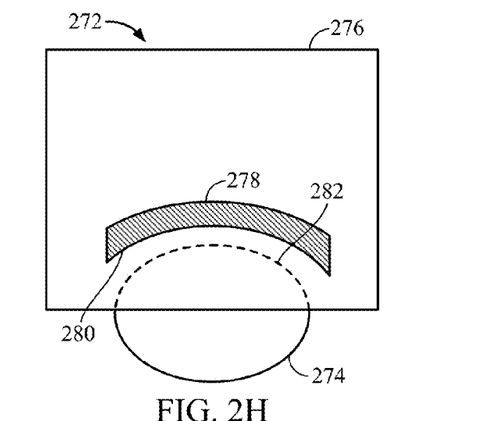

FIG. 2H depicts a tenth MIM capacitor 272, a substantially oval-shaped TGV 274, a substantially planar metal plate 276 and an overlapped region of dielectric material 278 having an inner edge 280 that is larger than the outer edge 282 of the substantially oval-shaped TGV 274. The inner edge 280 of the overlapped region of dielectric material 278 has a substantially concave edge. In an example, the overlapped region of dielectric material 278 does not extend beyond the edges of the metal plate 276. Also, an additional metal plate is coupled to the overlapped region of dielectric material 278 to complete the tenth MIM capacitor 272 and to define the size and shape of the overlapped region of dielectric material 278.

Figure 2I:
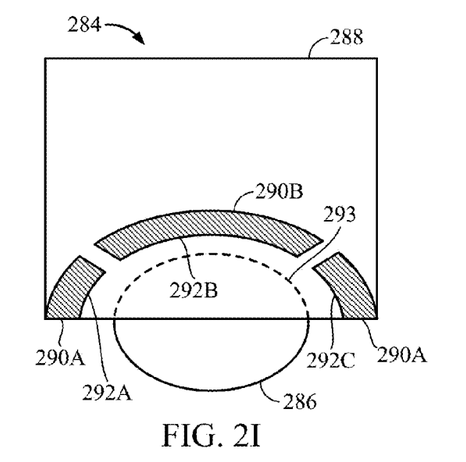

FIG. 2I depicts an eleventh MIM capacitor 284, a substantially oval-shaped TGV 286, a substantially planar metal plate 288 and overlapped regions of dielectric material 290A-C having inner edges 292A-C that are larger than the outer edge 293 of the substantially oval-shaped TGV 286. The overlapped regions of dielectric material 290A-C have substantially concave edges. In an example, the dielectric material 290A-C does not extend beyond any edges of the metal plate 288. Also, an additional metal plate is coupled to the overlapped regions of dielectric material 190A-C to complete the eleventh MIM capacitor 284 and to define the size and shape of the overlapped regions of dielectric material 290A-C.

Figure 2J:
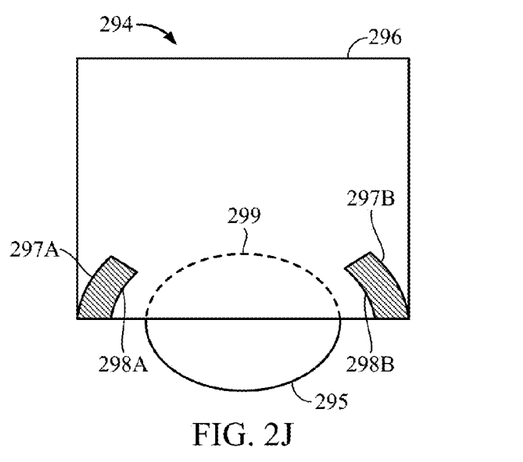

FIG. 2J depicts a twelfth MIM capacitor 294, a substantially oval-shaped TGV 295, a substantially planar metal plate 296 and overlapped regions of dielectric material 297A-B having inner edges 298A-B that are larger than the outer edge 299 of the substantially oval-shaped TGV 295. The overlapped regions of dielectric material 297A-C have substantially oval edges. In an example, the overlapped regions of dielectric material 297A-C do not extend beyond the edges of the metal plate 296. Also, an additional metal plate is coupled to the overlapped regions of dielectric material 297A-C to complete the twelfth MIM capacitor 294 and to define the size and shape of the overlapped regions of dielectric material 297A-C.

FIGS. 3A-3D depict exemplary respective current flows through the first MIM capacitor 100, the second MIM capacitor 120, the third MIM capacitor 140, and a conventional MIM (not shown) having a rectangular-shaped dielectric material that is located outside of a radius of a respective cylindrical TGV. The perspective of FIGS. 3A-3D is of the circular end of the respective TGV that is coupled to the respective MIM capacitor. From the perspective depicted in each of FIGS. 3A-3D, current flows out of the page toward the bottom of the page. The lighter regions of FIGS. 3A-3D depict regions having a lower current density, and the darker regions of FIGS. 3A-3D depict regions having a higher current density.

FIG. 3A depicts exemplary current flow 300 on the portion of the TGV 105 that contacts the substantially planar metal plate 110.

FIG. 3B depicts exemplary current flow 305 on the portion of the TGV 125 that contacts the substantially planar metal plate 130.

FIG. 3C depicts exemplary current flow 310 on the portion of the TGV 145 that contacts the substantially planar metal plate 150. In FIG. 3C, the substantially half-circle-shaped overlapped region of dielectric material 155 is located on the lower half of the TGV 145.

Figure 3D:
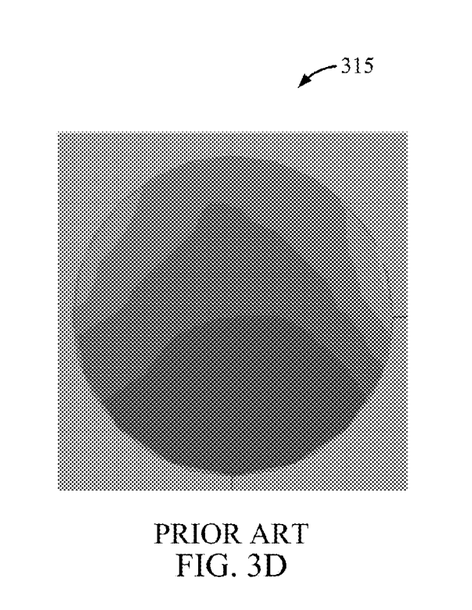

FIG. 3D, which is prior art, depicts exemplary current flow 315 on the portion of the respective TGV that contacts a metal plate. In FIG. 3D, a rectangular-shaped dielectric material is located beyond the lower part of the depicted TGV.

Figure 4:
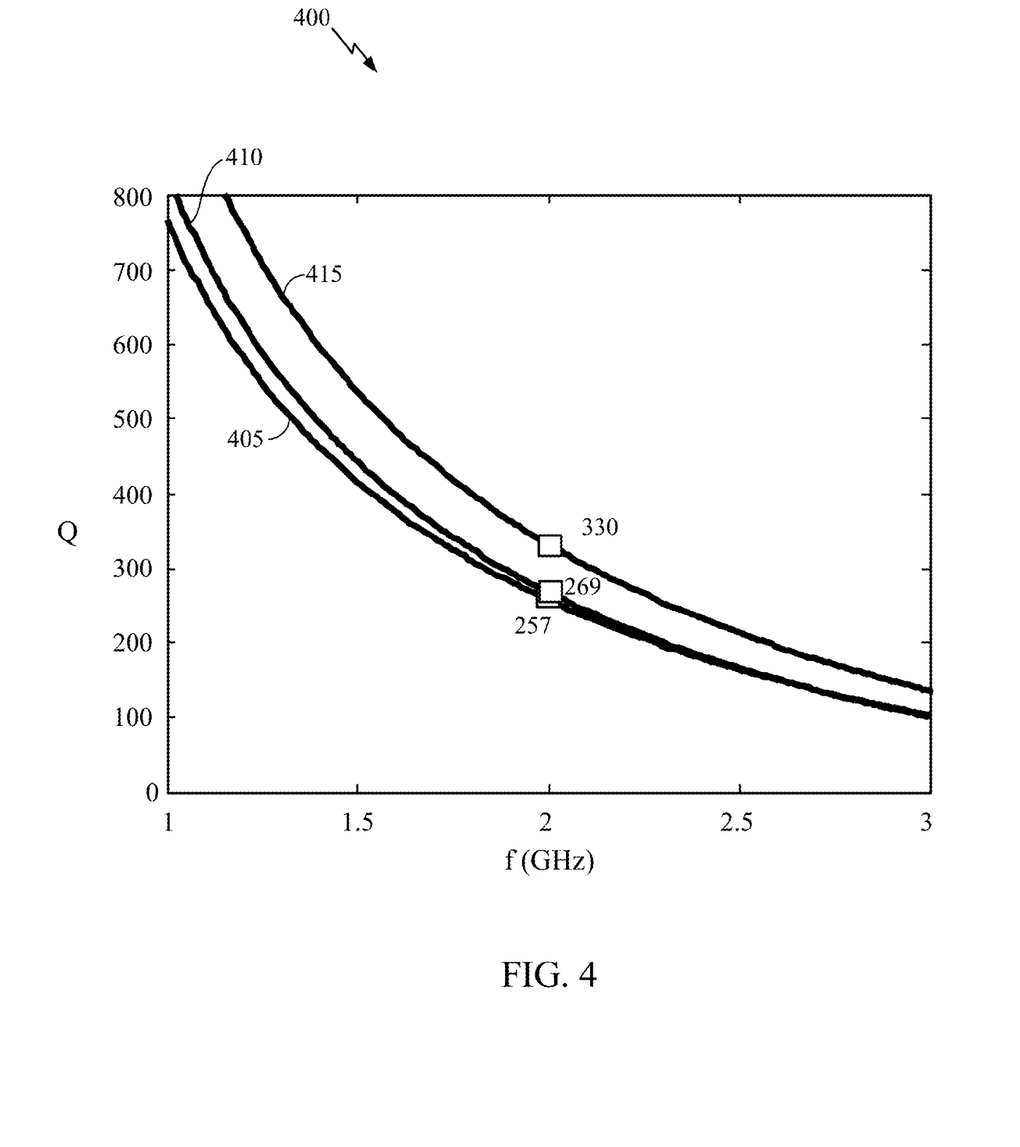
FIG. 4 depicts an exemplary graph of capacitor quality versus frequency.

FIG. 4 depicts an exemplary graph 400 of capacitor quality factor (Q) on the vertical axis versus frequency (f) on the horizontal axis. The lower curve 405 depicts "Q" of a conventional rectangular MIM capacitor having a rectangular-shaped dielectric material that is located outside of a radius of a respective cylindrical TGV. From the lower curve 405, at a frequency of 2 GHz, the conventional rectangular MIM capacitor has a "Q" of 257. The middle curve 410 depicts "Q" of the third MIM capacitor 140. From the middle curve 410, at a frequency of 2 GHz, the third MIM capacitor 140 has a "Q" of 269—an increase in quality over that of the conventional rectangular MIM capacitor. The upper curve 415 depicts "Q" of the fourth MIM capacitor 200. From the upper curve 415, at a frequency of 2 GHz, the fourth MIM capacitor 200 has a "Q" of 330—an increase in quality over the quality of the conventional rectangular MIM capacitor.

Figure 5:
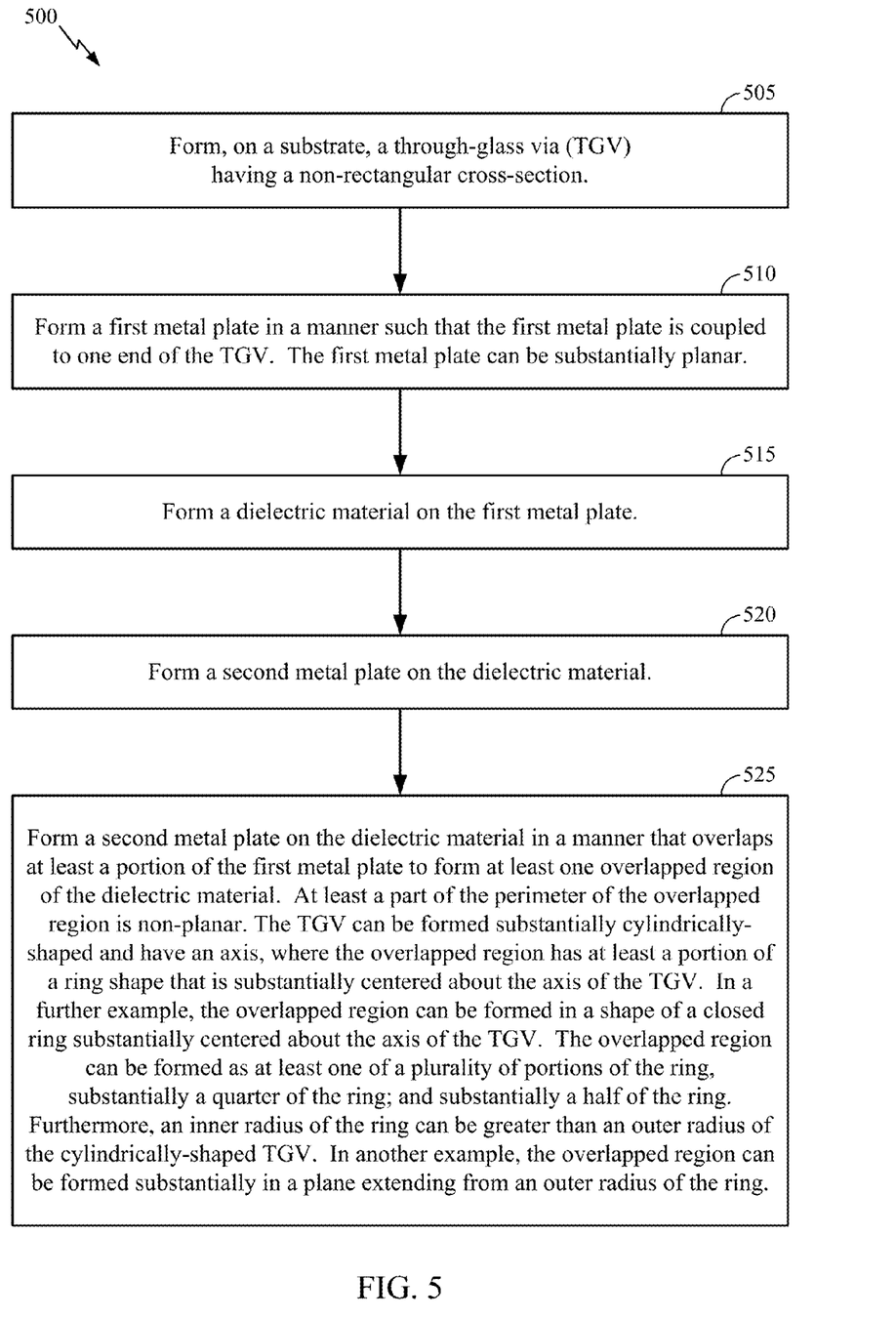
FIG. 5 depicts an exemplary method for fabricating a high-Q MIM capacitor.

FIG. 5 depicts an exemplary method for fabricating a MIM capacitor 500. The method for fabricating the MIM capacitor 500 can be performed by the apparatus described hereby, such as a lithographic device.

In step 505, a through-glass via (TGV) having a non-rectangular cross-section is formed on a substrate. In an example, the TGV can be a filled via. In a further example, the TGV can be a conformal plated via. The TGV can have a cross section that is substantially in a shape of a circle (i.e., at least a portion of the TGV is substantially a cylinder), an oval (i.e., a "race track") shape, an oblong shape, and/or the like.

In step 510, a first metal plate is formed in a manner such that the first metal plate is coupled to one end of the TGV. The first metal plate can be substantially planar, and can be formed in the same process step as metallization of the TGV (thus reducing a number of fabrication steps when compared to conventional techniques).

In step 515, a dielectric material is formed on the first metal plate.

In step 520, a second metal plate is formed on the dielectric material.

In step 525, a second metal plate is formed on the dielectric material in a manner that overlaps at least a portion of the first metal plate to form at least one overlapped region of the dielectric material. At least a part of the perimeter of the overlapped region is non-planar. The TGV can be formed substantially cylindrically-shaped and have an axis, where the overlapped region has at least a portion of a ring shape that is substantially centered about the axis of the TGV. In a further example, the overlapped region can be formed in a shape of a closed ring substantially centered about the axis of the TGV. The overlapped region can be formed as at least one of a plurality of portions of the ring, substantially a quarter of the ring; and substantially a half of the ring. Furthermore, an inner radius of the ring can be greater than an outer radius of the cylindrically-shaped TGV. In another example, the overlapped region can be formed substantially in a plane extending from an outer radius of the ring.

In another example, the TGV has a cross-section defining a perimeter of the TGV and the overlapped dielectric material has a cross-section that both defines a perimeter of the overlapped dielectric material and is parallel planar with the TGV cross-section. When the cross-section of the overlapped dielectric material is superimposed, in the same plane, on the TGV cross-section, then a portion of the perimeter of the overlapped dielectric material is substantially equidistant from the TGV perimeter. In an additional example, when the cross-section of the overlapped dielectric material is superimposed, in the same plane, on the TGV cross-section, then a distance between a portion of the perimeter of the overlapped dielectric material and the TGV perimeter is substantially constant.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

In some aspects, the teachings herein can be employed in a multiple-access system capable of supporting communication with multiple users by sharing the available system resources (e.g., by specifying one or more of bandwidth, transmit power, coding, interleaving, and so on). For example, the teachings herein can be applied to any one or combinations of the following technologies: Code Division Multiple Access (CDMA) systems, Multiple-Carrier CDMA (MCCDMA), Wideband CDMA (W-CDMA), High-Speed Packet Access (HSPA, HSPA+) systems, Time Division Multiple Access (TDMA) systems, Frequency Division Multiple Access (FDMA) systems, Single-Carrier FDMA (SC-FDMA) systems, Orthogonal Frequency Division Multiple Access (OFDMA) systems, or other multiple access techniques. A wireless communication system employing the teachings herein can be designed to implement one or more standards, such as IS-95, cdma2000, IS-856, W-CDMA, TDSCDMA, and other standards. A CDMA network can implement a radio technology such as Universal Terrestrial Radio Access (UTRA), cdma2000, or some other technology. UTRA includes W-CDMA and Low Chip Rate (LCR). The cdma2000 technology covers IS-2000, IS-95 and IS-856 standards. A TDMA network can implement a radio technology such as Global System for Mobile Communications (GSM). An OFDMA network can implement a radio technology such as Evolved UTRA (E-UTRA), IEEE 802.11, IEEE 802.16, IEEE 802.20, Flash-OFDM.®, etc. UTRA, E-UTRA, and GSM are part of Universal Mobile Telecommunication System (UMTS). The teachings herein can be implemented in a 3 GPP Long Term Evolution (LTE) system, an Ultra-Mobile Broadband (UMB) system, and other types of systems. LTE is a release of UMTS that uses E-UTRA. UTRA, E-UTRA, GSM, UMTS and LTE are described in documents from an organization named "3rd Generation Partnership Project" (3GPP), while cdma2000 is described in documents from an organization named "3rd Generation Partnership Project 2" (3GPP2). Although certain aspects of the disclosure can be described using 3GPP terminology, it is to be understood that the teachings herein can be applied to 3GPP (e.g., Re199, Re15, Re16, Re17) technology, as well as 3GPP2 (e.g., 1xRTT, 1xEV-DO RelO, RevA, RevB) technology and other technologies. The techniques can be used in emerging and future networks and interfaces, including Long Term Evolution (LTE).

At least a portion of the methods, sequences, and/or algorithms described in connection with the embodiments disclosed herein can be embodied directly in hardware, in software executed by a processor, or in a combination of the two. In an example, a processor includes multiple discrete hardware components. A software module may reside in RAM memory, flash memory, ROM memory, EPROM memory, EEPROM memory, registers, hard disk, a removable disk, a CD-ROM, and/or any other form of storage medium known in the art. An exemplary storage medium (e.g., a memory) can be coupled to the processor such that the processor can read information from, and write information to, the storage medium. In an alternative, the storage medium may be integral with the processor.

Further, many embodiments are described in terms of sequences of actions to be performed by, for example, elements of a computing device. The actions described herein can be performed by a specific circuit (e.g., an application specific integrated circuits (ASICs)), by program instructions being executed by one or more processors, or by a combination of both. Additionally, a sequence of actions described herein can be considered to be embodied entirely within any form of computer readable storage medium having stored therein a corresponding set of computer instructions that upon execution would cause an associated processor to perform at least a portion of a function described herein. Thus, the various aspects of the invention may be embodied in a number of different forms, all of which have been contemplated to be within the scope of the claimed subject matter. In addition, for each of the embodiments described herein, a corresponding circuit of any such embodiments may be described herein as, for example, "logic configured" perform a described action.

An embodiment of the invention can include a computer readable media embodying a method described herein. Accordingly, the invention is not limited to illustrated examples and any means for performing the functions described herein are included in embodiments of the invention.

The disclosed devices and methods can be designed and can be configured into a computer-executable file that is in a Graphic Database System Two (GDSII) compatible format, an Open Artwork System Interchange Standard (OASIS) compatible format, and/or a GERBER (e.g., RS-274D, RS-274X, etc.) compatible format, which are stored on a non-transitory (i.e., a non-transient) computer-readable media. The file can be provided to a fabrication handler who fabricates with a lithographic device, based on the file, an integrated device. In an example, the integrated device is on a semiconductor wafer. The semiconductor wafer can be cut into a semiconductor die and packaged into a semiconductor chip. The semiconductor chip can be employed in a device described herein (e.g., a mobile device).

Embodiments can include a non-transitory (i.e., a non-transient) machine-readable media and/or a non-transitory (i.e., a non-transient) computer-readable media embodying instructions which, when executed by a processor, transform a processor and any other cooperating devices into a machine (e.g., a special-purpose processor) configured to perform at least a part of a function described hereby and/or transform a processor and any other cooperating devices into at least a part of the apparatus described hereby.

Nothing stated or depicted in this application is intended to dedicate any component, step, feature, object, benefit, advantage, or equivalent to the public, regardless of whether the component, step, feature, object, benefit, advantage, or the equivalent is recited in the claims.

While this disclosure describes exemplary embodiments of the invention, it should be noted that various changes and modifications could be made herein without departing from the scope of the invention as defined by the appended claims.

What is claimed is:

1. A method for fabricating a capacitor, comprising:
   forming, on a substrate, a through-glass via (TGV) having a non-rectangular cross-section;
   forming a first metal plate, wherein one end face of the TGV is coupled to the first metal plate;
   forming a dielectric material on the first metal plate; and forming, on the dielectric material, a second metal plate in a manner that overlaps at least a portion of the first metal plate to form at least one overlapped region of the dielectric material, wherein at least a part of the perimeter of the at least one overlapped region is curved, and the dielectric material, the first metal plate, and the second metal plate are formed external to the TGV without extending past a perimeter of the one end face of the TGV.

2. The method of claim 1, wherein the TGV is formed substantially cylindrically-shaped and has an axis, and the at least one overlapped region has at least a portion of a ring shape that is substantially centered about the axis of the TGV.

3. The method of claim 2, wherein the at least one overlapped region is formed in a shape of a closed ring substantially centered about the axis of the TGV.

4. The method of claim 2, wherein the at least one overlapped region is formed as at least one of:
 a plurality of portions of the ring shape;
 substantially a quarter of the ring shape; and
 substantially a half of the ring shape.

5. The method of claim 2, wherein an inner radius of the ring shape is greater than an outer radius of the cylindrically-shaped TGV.

6. The method of claim 1, wherein the first metal plate is formed substantially planar.

7. The method of claim 2, wherein the at least one overlapped region is formed substantially in a plane extending from an outer radius of the ring shape.

8. A method for fabricating a capacitor, comprising:
 forming, on a substrate, a through-glass via (TGV) having a non-rectangular cross-section;
 forming a first metal plate, wherein one end face of the TGV is coupled to the first metal plate;
 forming a dielectric material on the first metal plate; and
 forming, on the dielectric material, a second metal plate in a manner that overlaps at least a portion of the first metal plate to form at least one overlapped region of the dielectric material, wherein at least a part of the perimeter of the at least one overlapped region is not straight or an intersection of two straight lines, and the dielectric material, the first metal plate, and the second metal plate are formed external to the TGV without extending past a perimeter of the one end face of the TGV.

9. The method of claim 8, wherein the TGV is formed substantially cylindrically-shaped and has an axis, and the at least one overlapped region is formed in at least a portion of a ring shape that is substantially centered about the axis of the TGV.

10. The method of claim 9, wherein the at least one overlapped region is formed in a shape of a closed ring substantially centered about the axis of the TGV.

11. The method of claim 9, wherein the at least one overlapped region is formed in at least one of:
 a plurality of portions of the ring shape;
 substantially a quarter of the ring shape; and
 substantially a half of the ring shape.

12. The method of claim 9, wherein an inner radius of the ring shape is greater than an outer radius of the cylindrically-shaped TGV.

13. The method of claim 8, wherein the first metal plate is formed substantially planar.

14. The method of 9, wherein the at least one overlapped region is formed substantially in a plane extending from an outer radius of the ring shape.

* * * * *